US006184525B1

United States Patent
Van Der Mast

(10) Patent No.: US 6,184,525 B1
(45) Date of Patent: Feb. 6, 2001

(54) ENVIRONMENTAL SEM WITH A MULTIPLE FIELDS FOR IMPROVED SECONDARY ELECTRON DETECTION

(75) Inventor: Karel D. Van Der Mast, Helmond (NL)

(73) Assignee: Philips Electron Optics B.V., Eindhoven (NL)

(*) Notice: Under 35 U.S.C. 154(b), the term of this patent shall be extended for 0 days.

(21) Appl. No.: 09/205,441

(22) Filed: Dec. 4, 1998

(30) Foreign Application Priority Data

Aug. 12, 1997 (EP) .................................. 97203839

(51) Int. Cl.⁷ ............................ H01J 37/26; H01J 37/145
(52) U.S. Cl. ......................... 250/310; 250/398; 250/397; 250/396 R; 250/492.3
(58) Field of Search .................................. 250/310, 398, 250/397, 396 R, 492.3

(56) References Cited

U.S. PATENT DOCUMENTS 4,785,182 11/1988 Mancuso et al. .................. 250/310
5,221,844 * 6/1993 Van Der Mast et al. ........... 250/398

FOREIGN PATENT DOCUMENTS 5-174768 7/1993 (JP) .

* cited by examiner

Primary Examiner—Bruce C. Anderson
Assistant Examiner—Nikita Wells
(74) Attorney, Agent, or Firm—Fulbright & Jaworski LLP

(57) ABSTRACT

Amplification of the current of secondary electrons emanating from the specimen 14 is realized in an ESEM by avalanche-like ionization of the molecules 41 of the gas atmosphere. However, in order to achieve an adequate number of successive ionizations, a comparatively high value of the electric field at the detector electrode 46 is required and, because of the risk of electric breakdowns, the distance between the specimen and the detector electrode may not be smaller than a comparatively large minimum distance. The number of successive ionizations, and hence the current amplification, is thus limited. The invention proposes to configure the electric field of the detector 46, 50, co-operating with the magnetic field 52 of the immersion lens 8 already present in the ionization space, as an electric multipole field. In the case of electric multipoles, at a given field strength on the optical axis the electric field strength outside the optical axis may be substantially higher. Thus, while influencing the primary electron beam slightly only, a strong detector field can be provided so that the secondary electrons to be accelerated receive adequate energy to realize numerous multipole ionizations, and hence a high current amplification in the gas atmosphere around the specimen.

12 Claims, 3 Drawing Sheets

Figure 1:
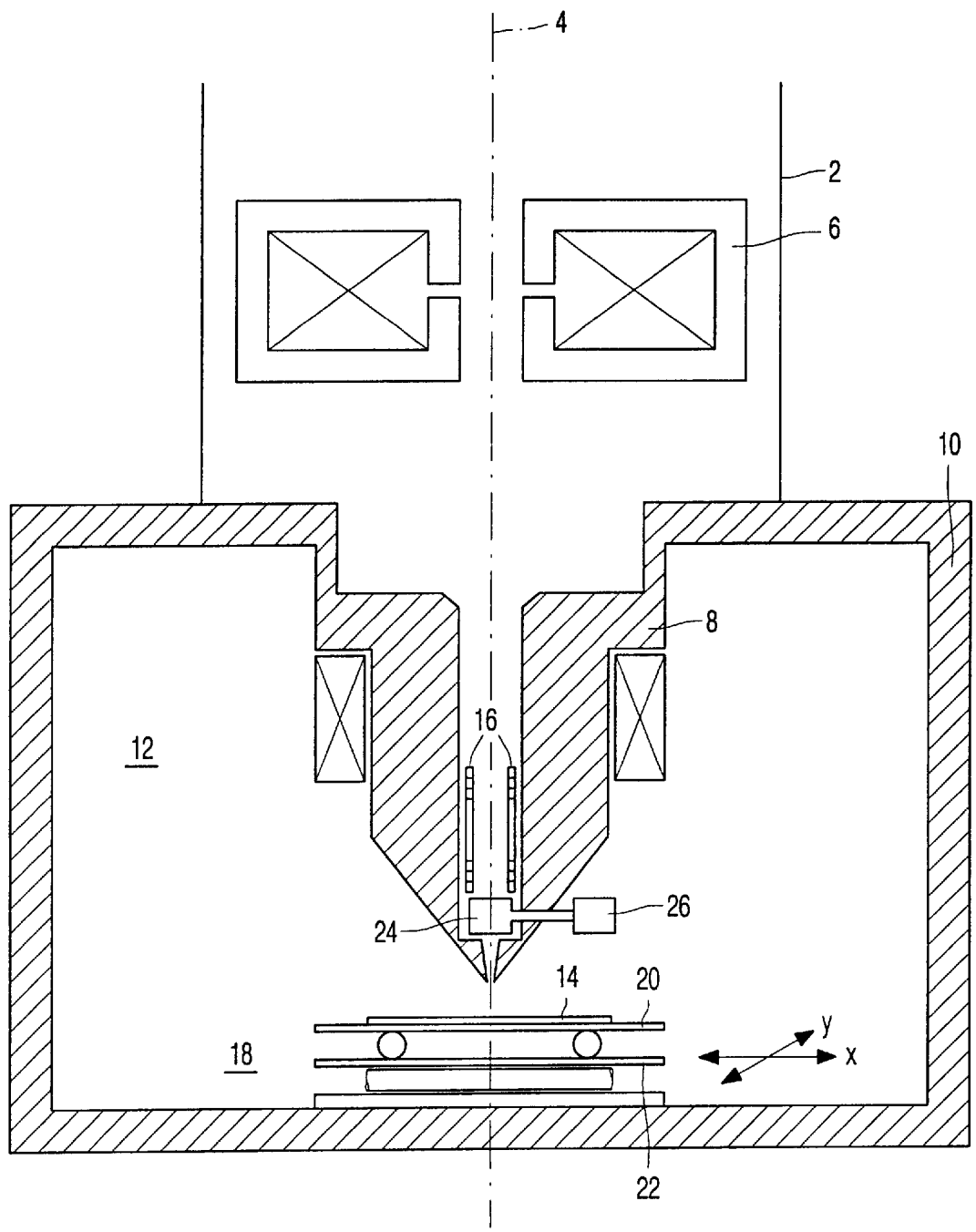

ENVIRONMENTAL SEM WITH A MULTIPLE FIELDS FOR IMPROVED SECONDARY ELECTRON DETECTION

The invention relates to a particle-optical apparatus which includes a particle source for producing a primary beam of electrically charged particles which travel along an optical axis (4) of the apparatus, a specimen holder for a specimen to be irradiated by means of the apparatus, an immersion lens for forming a focus of the primary beam in the vicinity of the specimen holder, scanning means for scanning the specimen by means of the focused beam, detection means for detecting signals originating from the specimen in response to the incidence of the primary beam, which detection means include an electrostatic detection electrode for generating an electric field in the space between the detection electrode and the specimen holder.

An apparatus of this kind is known from the abstract No. 5-174768 (A) of Japanese patent application No. 3-53811, published on 13.7.93.

Apparatus of the kind set forth are known as Scanning Electron Microscopes (SEM). In a SEM a region of a specimen to be examined is scanned by means of a primary beam of electrically charged particles, usually electrons, which travel along an optical axis of the apparatus. The acceleration voltage for the electron beam in the SEM is chosen in dependence on the nature of the specimen to be examined. This acceleration voltage should have a comparatively low value (of the order of magnitude of 1 kV) so as to minimize the charging of the specimen by the primary electron beam. This could take place, for example during the study of electrically insulating layers in integrated electronic circuits or for given biological specimens. Moreover, for some examinations it is desirable that the electrons of the primary beam penetrate the specimen to a small depth only, resulting in a better contrast of the image to be formed. Other specimens, however, require a higher acceleration voltage, for example of the order of magnitude of 30 kV.

Irradiation of the specimen to be examined releases electrically charged particles (generally secondary electrons) which have an energy which is substantially lower, for example of the order of magnitude of from 5 to 50 eV. The energy and/or the energy distribution of these secondary electrons provides information as regards the nature and the composition of the specimen. Therefore, a SEM is attractively provided with a detector for secondary electrons. These electrons are released at the side of the specimen where the primary beam is incident, after which they travel back against the direction of incidence of the primary electrons. When a detector (for example, provided with an electrode carrying a positive voltage of 300 V) is arranged in the vicinity of the secondary electrons thus travelling back, the secondary electrons are captured by this electrode and the detector outputs an electric signal which is proportional to the electric current thus detected. The (secondary electron) image of the specimen is thus formed in known manner. With a view to the quality of the image, notably the speed at which the image is formed and the signal-to-noise ratio, the detected current is preferably as large as possible.

In a so-called Environmental SEM (ESEM) the specimen is arranged in an atmosphere of a gas at a pressure of between 0.01 Torr ($\approx$1.3 N/m$^2$) and 20 Torr (=2630 N/m$^2$), so a pressure which is many times higher than the pressure at which conventional SEMs operate. An electric field, produced by the voltage between the specimen and an is electrostatic detection electrode associated with the detection means for detecting signals originating from the specimen in response to the incidence of the primary beam, accelerates the secondary electrons emanating from the specimen to such a speed that they are capable of ionizing the atoms of the gas enveloping the specimen. During these ionizations, one or more electrons are released from the gas atoms, which electrons themselves are accelerated and can release electrons by further ionizations again, etc. The gas surrounding the specimen thus acts as an amplifier for the secondary electron current, so that the current to be detected can in principle be larger than the current caused by the secondary electrons themselves.

Further advantages of a SEM operating with a gas atmosphere (to be referred to hereinafter as an "Environmental SEM" or ESEM) over the conventional SEM consist in that the ESEM enables the formation of electron optical images of humid or nonconductive specimens (for example, biological specimens, synthetic materials, ceramic materials or glass fibers) which are extremely difficult to image in the customary vacuum conditions in the conventional SEM. The ESEM enables the specimen to be maintained in its "natural" condition, without the specimen having to be subjected to the adverse effects of drying, freezing or vacuum coating operations which are normally required for the study by means of electron beams in high vacuum conditions.

Furthermore, because of the comparatively high permissible pressure in the specimen space of the ESEM, the gas ions formed neutralize any electric charging of a nonconductive specimen which could otherwise impede the formation of an image of high resolution. The ESEM also enables direct, real-time observation of phenomena such as transport of liquids, chemical reactions, solution, crystallization and other processes taking place at a comparatively high vapor pressure which is far beyond that permissible in the specimen of a conventional SEM.

According to the cited abstract No. 5-174768(A) the primary beam is focused on the specimen by an immersion lens. As is known, an immersion lens is a magnetic lens which produces a magnetic field in the space between the poleshoes of the lens and the specimen. The electrons released from the specimen by the primary beam then travel back from the specimen to the electrostatic detection electrode of the detector while following approximately the field lines of the immersion lens. The electrostatic detection electrode disclosed in the cited abstract is an annular electrode which generates an electric field between the specimen (carrying a voltage which is lower than that present at this electrode) and this electrode. In order to achieve a sufficiently high current amplification effect by the gas atmosphere in the ESEM, however, a comparatively high voltage is required for the detector electrode and, because of the risk of electric breakdowns, the distance between the specimen and the detector electrode may not be smaller than a comparatively large minimum distance. Consequently, the number of successive ionizations is limited, and hence also the current amplification.

It is an object of the invention to provide an ESEM having a current amplification which is higher than that of the known ESEM. To this end, the particle-optical apparatus according to the invention is characterized in that the detection means are arranged to produce an electric multipole field around the optical axis which extends transversely of the optical axis in the same space as the magnetic field of the immersion lens.

The invention utilizes the property of electric multipoles that at a given field strength at the optical axis of the multipole the electric field strength outside the optical axis may be substantially higher. Thus, while exerting a slight effect only on the primary electron beam, a strong detector field can nevertheless be provided so that the secondary electrons to be accelerated receive adequate energy so as to realize numerous multipole ionizations, and hence a high current amplification in the gas atmosphere around the specimen. Moreover, the space angle at which the specimen is "perceived" by the electrode assembly producing the electric multipole field is very large.

The invention is based on the recognition of the fact that, as is known, an electron moving in a magnetic field experiences a force which is directed perpendicularly to the direction of movement and also perpendicularly to the magnetic field. In the absence of a magnetic field, a secondary electron travelling from the specimen to the detector electrode will follow a practically straight path to the detector electrode, except for changes of direction due to collisions with gas atoms. In the presence of a magnetic field, therefore, such an electron is deflected away from its direction of movement to the detector electrode. (Theoretically speaking, in the case of given field geometries it cannot even reach the detector electrode in the absence of loss of energy). Consequently, this electron will travel a substantially longer distance, so that the probability of collisions with the gas atoms is substantially increased. Because of the ionizing collisions with the gas atoms, such an electron loses each time a given amount of energy during its travel, so that ultimately it can be captured by the detector electrode after all. During this substantially longer travel, therefore, this electron will have experienced a proportionally larger number of ionizing collisions, and hence have released a larger number of electrons. The same also holds for the electrons released by such collisions. Thus, a cascade of released electrons is formed, ensuring that the signal to be detected is much greater than in the absence of an additional magnetic field. The signal to be detected may take various forms, all of which constitute a representation of the current of electrons released from the specimen.

It is to be noted that in the context of the present invention the phrase "the space between the detection means and the specimen holder" is to be understood to mean the space traversed by electrically charged particles (and possibly particles produced by said particles, for example electrons and ions produced by ionizations) before they are captured by a detector electrode.

The detection means in an embodiment of the invention are also arranged to produce a magnetic multipole field around the optical axis which extends transversely of the optical axis in the same space as the electric multipole field. This embodiment is particularly attractive when the magnetic field produced in the specimen space by the focusing device itself is not strong enough so as to achieve the desired prolongation of the path length of the electrons for the electron multiplication. This embodiment utilizes the property of magnetic multipoles that at a given field strength at the optical axis of the multipole, the magnetic field strength outside the optical axis may be substantially higher. Thus, while exerting a slight effect only on the primary electron beam, a strong magnetic field can nevertheless be obtained so as to increase the path length of the secondary electrons.

A preferred embodiment of the particle-optical apparatus according to the invention is provided with adjusting means for adjusting the strength of the multipole field independently of the focusing device. This offers a high degree of flexibility of use of the apparatus, enabling the multipole field to be adapted to a variety of imaging parameters which are subject to change, for example the distance between the specimen and the objective lens, the number of secondary electrons per primary electron, the acceleration voltage, the gas pressure in the specimen space, the number of ions required for the discharging of the specimen, etc.

The detection of the signal to be detected in an embodiment of the invention takes place in that the signals originating from the specimen in response to the incidence of the primary beam are formed by electrically charged particles originating from the specimen. This current of electrically charged particles originating from the specimen may be the current of secondary electrons (i.e. the total number of the electrons released from the specimen and the electrons produced by multiplication in the gas discharge). Alternatively, the current of electrically charged particles originating from the specimen is formed by a current of ions which arises in the gas discharge, moves to the specimen under the influence of the electric field and can be measured as a specimen current. A third possibility consists in that the current of electrically charged particles originating from the specimen is formed by a current of ions which arises in the gas discharge and moves, under the influence of, for example, an electric field produced by the detection means, to an electrode of the detection means and can be measured as a detector current. It is alternatively possible to combine two or more of the currents thus formed and to detect the signal then arising.

In a further embodiment of the invention, the detection of the signal to be detected takes place in that the signals originating from the specimen in response to the incidence of the primary beam are formed by light signals which are generated by gas ionizations in the electric multipole field. This effect is also amplified by the larger electric and/or magnetic detector field since therein the energy and/or the path length of the secondary electrons is increased and hence also the number of ionizations and also the amount of light generated thereby.

Figure 2:
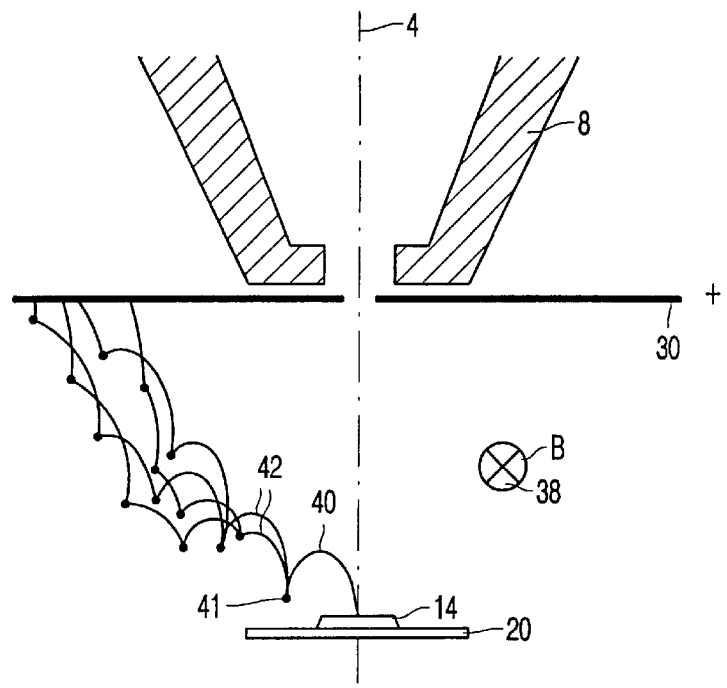
Figure 4:
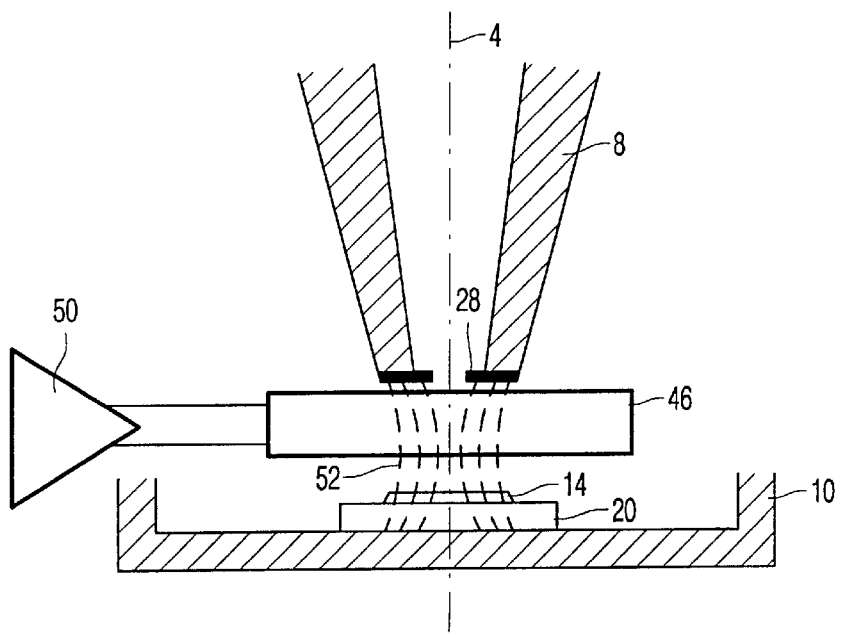
Figure 3A:
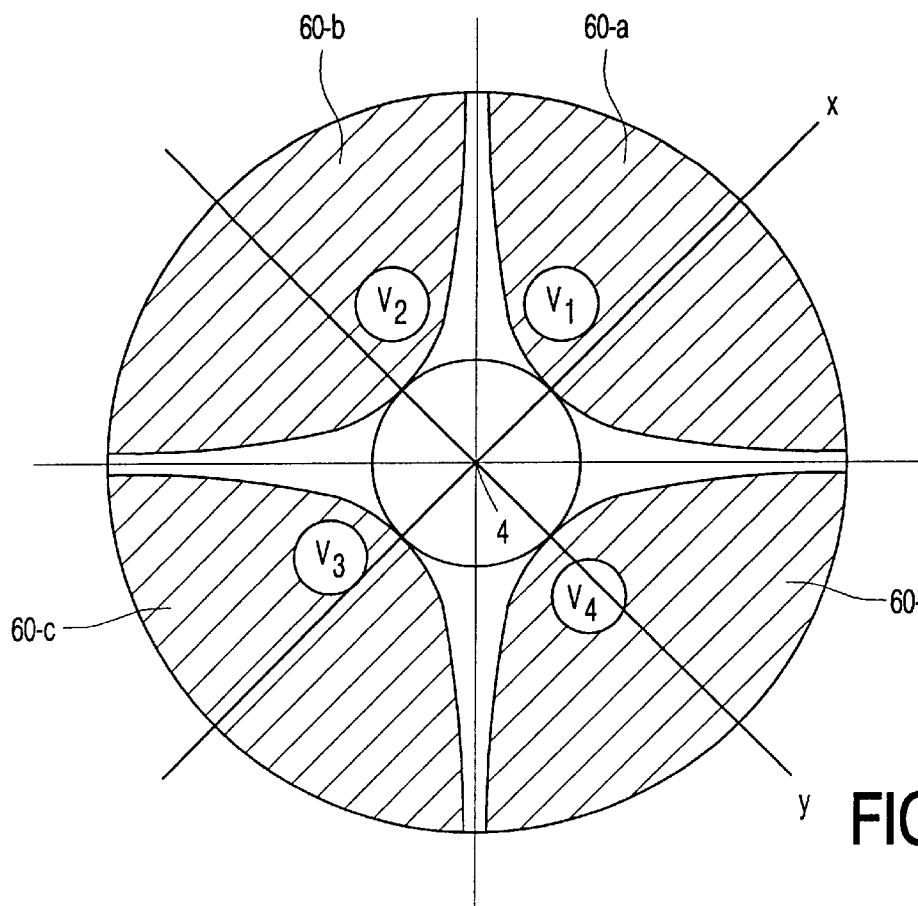
Figure 3B:
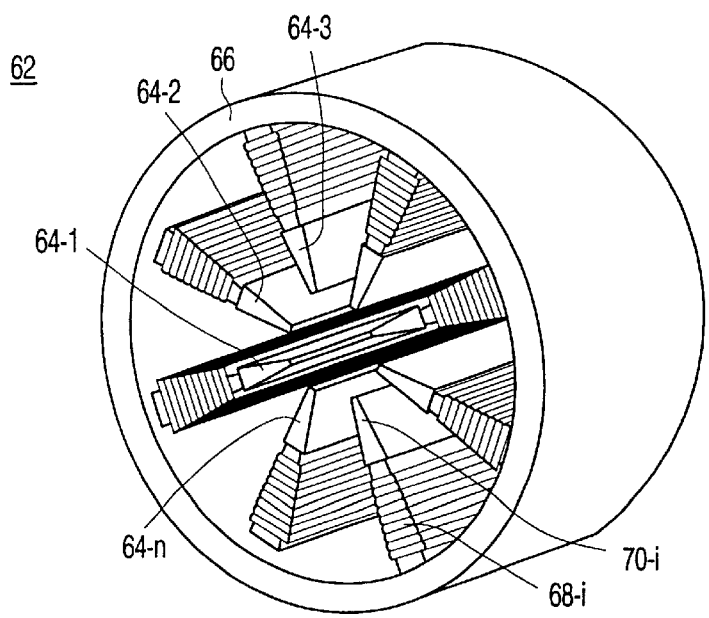

The invention will be described in detail hereinafter with reference to the Figures in which corresponding reference numerals denote corresponding elements. Therein:

FIG. 1 is a diagrammatic representation of a particle-optical instrument in which the invention can be used, FIG. 2 illustrates diagrammatically the process of electron multiplication by means of an electric and a magnetic field;

FIG. 3*a* is a diagrammatic representation of an electrode assembly for generating an electric quadrupole field;

FIG. 3*b* is a perspective view of a pole configuration for generating an electric and/or magnetic multipole field;

FIG. 4 is a cross-sectional view of a specimen space with an immersion lens whose magnetic field co-operates with the electric and/or magnetic multipole field of the detector.

FIG. 1 shows a particle-optical instrument in the form of a part of a column 2 of a scanning electron microscope (SEM). As is customary, an electron source (not shown in the Figure) in this instrument produces a beam of electrons which travels along the optical axis 4 of the instrument. This electron beam can pass through one or more electromagnetic lenses, such as the condensor lens 6, after which it reaches the lens 8. This lens, being a so-called monopole lens, forms part of a magnetic circuit which is furthermore formed by the wall 10 of the specimen chamber 12. The lens 8 is used to form an electron beam focus whereby the specimen 14 is scanned. Such scanning takes place by moving the electron beam across the specimen in the x direction as well as in the y direction by means of scan coils 16 provided in the lens 8.

The specimen 14 is arranged on a specimen table 18 which includes a carrier 20 for the x displacement and a carrier 22 for the y displacement. A desired region of the specimen can be selected for examination by means of these two carriers. Secondary electrons which travel back in the direction of the lens 8 are released from the specimen. These secondary electrons are detected by a detector 24 which is to be described hereinafter and is arranged in the bore of this lens. A control unit 26 is connected to the detector in order to activate the detector and to convert the current of detected electrons into a signal which can be used to form an image of the specimen, for example by means of a cathode ray tube.

FIG. 2 illustrates diagrammatically the process of electron multiplication by means of an electric and a magnetic field in a gas atmosphere. It is to be noted that for simplicity of the movements of the electrons, a plate-shaped detection electrode is assumed and not a multipole configuration; however, this is not of essential importance in clarifying the principle of the electron multiplication.

The primary electron beam (not shown in the Figure), focused by a preceding objective lens 8, is incident on a specimen 14 on a specimen holder 20 along the optical axis 4 of the apparatus. For the sake of simplicity of the description it is assumed that the detector electrode is constructed as a plate 30 which is arranged underneath the objective lens 8. At the center of this detector plate 30 there is provided an opening for the passage of the primary beam. The detector electrode 30 carries a positive voltage, so that the secondary electrons released in the specimen are accelerated in the direction of this electrode. For the simplicity of the illustration, in FIG. 2 a magnetic field B is assumed to extend perpendicularly to the plane of drawing, as denoted by the symbol 38. A secondary electron 14, emanating from the specimen 14, is accelerated in the direction of the electrode 30 by the electric field produced by the combination of the positive electrode 30 and the grounded specimen 40. Because of the speed of the electron, it is deflected by the magnetic field B so as to follow a cycloid path 40. If it were not to lose any energy while travelling this path, the presence of the field B would prevent the electron from ever reaching the electrode 30. The voltage at the electrode 30 is sufficiently high (for example, 300 V) to ensure that, while following this path, the electron can take up sufficient energy to ionize a gas atom 41 present in the specimen space, with the result that at least one additional free electron is formed. The ionizing electron as well as the additional electron is accelerated again in a cycloid path 42, by the electric field, after which the described process can repeat itself. The ionizing electron has lost a given amount of energy during ionization, so that it starts to travel along a path which is situated nearer to the electrode 30. The described process is repeated for all electrons moving in the specimen space and continues for all electrons until the relevant electron reaches the electrode 30. For the sake of simplicity of the drawing, double the number of electrons is not shown for each ionizing collision. An avalanche-like discharge is thus achieved in the specimen space, the probability of collision of an electron with a gas atom being substantially increased by the presence of the additional magnetic field. The quantity of electrons released by ionizations is thus increased in proportion and hence also the current signal formed by the secondary electrons.

FIG. 3a shows the shape of an electrode assembly for producing an electric multipole field around the optical axis which extends transversely of the optical axis. The electrode assembly shown in FIG. 3a consists of four plate-shaped conductors (poles) 60-a, 60-b, 60-c and 60-d which are electrically insulated from one another and are all situated in one plane, symmetrically grouped around the optical axis 4 which extends perpendicularly to the plane of drawing in this Figure. This Figure also shows the mutually perpendicular x-y directions. The boundary line of these poles which faces the optical axis is shaped as a hyperbola, arranged around an imaginary central circle which is tangent to the hyperbolas. For the simplicity of manufacture, the hyperbolic shape can be approximated in known manner by means of a circle of arc. Each of the poles 60-a to 60-d can be adjusted to a potential $V_1$, $V_2$, $V_3$ and $V_4$, respectively. In the simplest case $V_1$ and $V_3$ are equal, like $V_2$ and $V_4$, which then oppose $V_1$ and $V_3$. The Figure shows only one layer of electrodes; however, if desirable it is also possible to provide a plurality of layers one above the other (i.e. parallel to the plane of drawing, but above or below this plane). A higher degree of flexibility is thus obtained in respect of the design and/or the excitation of the electric quadrupole.

It is also possible to add one fixed amount to all of said potentials of the poles 60-a to 60-d, without the quadrupole effect being lost. This fixed amount may have a different value for a next layer of electrodes, so that an electrostatic monopole, so an element having a lens effect, is superposed on the quadrupole.

FIG. 3b is a perspective view of a pole configuration for generating an electric and/or magnetic multipole field. The multipole configuration in this Figure is formed by a magnetic circuit which consists of a cylindrical envelope 66 in which a number of n poles 64-1 to 64-n is provided so as to be uniformly distributed across the cylinder, n being equal to 8 in this Figure. Even though in principle no multipole fields of an order higher than quadrupoles are required so as to carry out the invention, for the compensation of, for example mechanical imperfections it is desirable to have a possibility for generating also higher-order fields, for example n=8 as in this Figure, whereas n=12 is also possible. However, this possibility is not of essential importance to the invention. The cylinder axis of the envelope 66 coincides with the optical axis 4 of the particle-optical instrument shown in FIG. 1.

The various multipole fields, i.e. the magnetic as well as the electrostatic fields, are generated by means of the n poles. Each of these poles is arranged to generate an electric as well as a magnetic field, the pole surfaces determining these multipole fields extending parallel to the optical axis of the apparatus. Each pole 64-1 is provided with an excitation coil 68-i for generating a magnetic field and with a pole cap 70-i for generating an electric field. Each of the excitation coils 68-i and each of the pole caps 70-i can be individually excited, so that each of the desired multipole fields, both electric and magnetic, can be generated by means of the 8 poles 64-1 to 64-8.

FIG. 3 is a cross-sectional view of a specimen space with an immersion lens whose magnetic field co-operates with the electric and/or magnetic multipole field of the detector. The magnetic circuit for generating the focusing field for the immersion lens consists of the funnel-shaped poles 8 of the immersion lens and the wall 10 of the specimen chamber 12 which is in contact therewith (for the magnetic flux). The magnetic field lines 52, consequently, extend from the end of the funnel-shaped poles 8 of the immersion lens to the specimen 14 which is in contact with the magnetic circuit via the specimen holder 20, i.e. the wall 10. A multipole device 46, whose symmetry axis coincides with the optical axis 4, is accommodated in the same space as the magnetic field 52 of the immersion lens. The diagrammatically represented multipole device 46 thus has the shape of the multipole of FIG. 3*b* or the electric quadrupole of FIG. 3*a*. In the case of FIG. 3*a*, the height of the rectangle 46 constitutes the thickness of the plate-shaped conductors 6-*a* to 60*d*; in the case of FIG. 3*b*, the height of the rectangle 46 constitutes the dimension in the axial direction of the cylindrical envelope 66.

As is known, for various reasons the pressure in this column must be substantially lower than said values (up to≈2500 N/m$^2$) of the pressure in the specimen space of the ESEM. In order to enable this pressure difference to be sustained, a separating diaphragm 28 is provided in known manner between the specimen space and the column 2. The diaphragm 28 is provided with a bore of, for example 0.1 mm. The desired low pressure in the column can be sustained by providing a pumping opening (not shown) directly above this diaphragm.

The excitation of the various poles of the multipole device 56 is realized by means of a controllable power supply source 50 which is connected to the multipole device 46 via two connections as diagrammatically shown in the Figure. This power supply source is arranged in such a manner that it can deliver various independently controllable voltages for the electrostatic electrodes and various independently controllable currents for the magnetic poles.

The embodiment shown in FIG. 4 offers a detector with a comparatively wide space angle for capturing the secondary electrons and with a discharge space between the poles in which the electrons may be contained for a comparatively long period of time so that they can take up an adequate amount of electric (so kinetic) energy and hence a high current amplification of the secondary electrons can take place. The further processing of the current signal formed by the secondary electrons takes place in a processing unit (not shown) which is connected to the various poles. The further processing of the current signal is not important to the invention, so that it will not be described in detail.

What is claimed is:

1. A particle-optical apparatus comprising:

a particle source for producing a primary beam of electrically charged particles which travel along an optical axis of the apparatus, a specimen holder for a specimen to be irradiated by means of the apparatus, an immersion lens for forming a focus of the primary beam in the vicinity of the specimen holder, scanning means for scanning the specimen by means of the focused beam, detection means for detecting signals originating from the specimen in response to the incidence of the primary beam, which detection means include an electrostatic detection electrode for generating an electric field in the space between the detection electrode and the specimen holder, the detection means arranged to produce an electric multipole field around the optical axis which extends transversely of the optical axis in the same space as the magnetic field of the immersion lens.

2. A particle-optical apparatus as claimed in claim 1, in which the detection means are also arranged to produce a magnetic multipole field around the optical axis which extends transversely of the optical axis in the same space as the electric multipole field.

3. A particle-optical apparatus as claimed in claim 1, including adjusting means for adjusting the strength of the multipole field independently of the focusing device.

4. A particle-optical apparatus as claimed in claim 3, in which the signals originating from the specimen in response to the incidence of the primary beam are formed by electrically charged particles originating from the specimen.

5. A particle-optical apparatus as claimed in claim 3, in which the signals originating from the specimen in response to the incidence of the primary beam are formed by light signals which are generated by gas ionizations in the electric multipole field.

6. A particle-optical apparatus as claimed in claim 2, in which the signals originating from the specimen in response to the incidence of the primary beam are formed by light signals which are generated by gas ionizations in the electric multipole field.

7. A particle-optical apparatus as claimed in claim 2, in which the signals originating from the specimen in response to the incidence of the primary beam are formed by electrically charged particles originating from the specimen.

8. A particle-optical apparatus as claimed in claim 2, including adjusting means for adjusting the strength of the multipole field independently of the focusing device.

9. A particle-optical apparatus as claimed in claim 8, in which the signals originating from the specimen in response to the incidence of the primary beam are formed by electrically charged particles originating from the specimen.

10. A particle-optical apparatus as claimed in claim 8, in which the signals originating from the specimen in response to the incidence of the primary beam are formed by light signals which are generated by gas ionizations in the electric multipole field.

11. A particle-optical apparatus as claimed in claim 1, in which the signals originating from the specimen in response to the incidence of the primary beam are formed by electrically charged particles originating from the specimen.

12. A particle-optical apparatus as claimed in claim 1, in which the signals originating from the specimen in response to the incidence of the primary beam are formed by light signals which are generated by gas ionizations in the electric multipole field.

* * * * *

UNITED STATES PATENT AND TRADEMARK OFFICE
CERTIFICATE OF CORRECTION

PATENT NO.     : 6,184,525 B1
DATED          : February 6, 2001
INVENTOR(S)    : Karel D. Van Der Mast It is certified that error appears in the above-identified patent and that said Letters Patent is hereby corrected as shown below:

Title page,
Item [30], Foreign Application Priority Date should be -- December 8, 1987 -- and not "August 12, 1997" as shown.
Item [54], delete "MULTIPLE" and insert, therefor -- MULTIPOLE --.

Column 8,
Line 1, after "detection means" and insert, therefor -- being --.

Signed and Sealed this

Seventh Day of May, 2002

Attest:

JAMES E. ROGAN
*Attesting Officer*          *Director of the United States Patent and Trademark Office*